United States Patent
Gu-Stoppel et al.

(10) Patent No.: US 9,733,470 B2
(45) Date of Patent: Aug. 15, 2017

(54) DEVICE COMPRISING A VIBRATABLY SUSPENDED OPTICAL ELEMENT

(71) Applicant: Fraunhofer-Gesellschaft zur Foerderung der angewandten Forschung e.V., Munich (DE)

(72) Inventors: Shanshan Gu-Stoppel, Itzehoe (DE); Hans Joachim Quenzer, Itzehoe (DE); Joachim Janes, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/280,487

(22) Filed: May 16, 2014

(65) Prior Publication Data
US 2014/0340726 A1    Nov. 20, 2014

(30) Foreign Application Priority Data
May 17, 2013    (DE) .................. 10 2013 209 234

(51) Int. Cl.
  G02B 26/08    (2006.01)
  B81B 3/00    (2006.01)

(52) U.S. Cl.
  CPC ........ G02B 26/0833 (2013.01); B81B 3/0045 (2013.01); B81B 2201/042 (2013.01); B81B 2203/019 (2013.01); B81B 2203/0109 (2013.01); B81B 2203/0163 (2013.01)

(58) Field of Classification Search
  CPC ............ G02B 26/0833; G02B 26/0858; G02B 26/0841; G02B 26/0866; B81B 3/0045; B81B 2201/042; B81B 2203/0109; B81B 2203/0163; B81B 2203/019
  USPC ............ 359/224, 198.1–199.4, 200.6–200.8, 359/221.2; 310/309, 311
  See application file for complete search history.

(56) References Cited

U.S. PATENT DOCUMENTS

| | | | | |
|---|---|---|---|---|
| 6,061,164 A | * | 5/2000 | Ikegame | F16F 1/025 359/199.1 |
| 6,198,565 B1 | | 3/2001 | Iseki et al. | |
| 6,632,373 B1 | | 10/2003 | Rosa et al. | |
| 6,644,821 B2 | * | 11/2003 | Ikegame | G02B 7/1821 359/225.1 |
| 6,657,764 B1 | | 12/2003 | Smits | |
| 6,836,366 B1 | | 12/2004 | Flanders et al. | |
| 7,190,502 B2 | | 3/2007 | Filhol | |

(Continued)

FOREIGN PATENT DOCUMENTS

| | | |
|---|---|---|
| CN | 201621218 U * | 11/2010 |
| DE | 60118126 | 9/2006 |

(Continued)

*Primary Examiner* — Scott J Sugarman
*Assistant Examiner* — Ibrahima Diedhiou
(74) *Attorney, Agent, or Firm* — Michael A. Glenn; Perkins Coie LLP

(57) ABSTRACT

The underlying invention presents a device which connects a vibratably suspended optical element to at least two actuators mounted fixedly on one side via curved spring elements, wherein the actuators are implemented to cause the vibratably suspended optical element to vibrate via the curved spring elements. Both the actuators and the entire system may be implemented to be more robust and be operated more reliably due to the curved shaping of the spring elements.

26 Claims, 15 Drawing Sheets

(56) References Cited

U.S. PATENT DOCUMENTS

| | | | |
|---|---|---|---|
| 7,486,430 B2 * | 2/2009 | Gan et al. | 359/290 |
| 8,125,699 B2 | 2/2012 | Akedo et al. | |
| 8,570,637 B2 | 10/2013 | Conrad | |
| 2002/0146200 A1 | 10/2002 | Kudrle et al. | |
| 2002/0171327 A1 | 11/2002 | Miller et al. | |
| 2006/0141659 A1 | 6/2006 | Gan et al. | |
| 2007/0120438 A1 | 5/2007 | Divoux et al. | |
| 2010/0277783 A1 * | 11/2010 | Takahashi | 359/214.1 |
| 2013/0063800 A1 | 3/2013 | Naono | |

FOREIGN PATENT DOCUMENTS

| | | |
|---|---|---|
| DE | 102010028111 | 10/2011 |
| EP | 2233961 | 9/2010 |

* cited by examiner

DEVICE COMPRISING A VIBRATABLY SUSPENDED OPTICAL ELEMENT

CROSS-REFERENCE TO RELATED APPLICATION

This application claims priority from German Patent Application No. 10 2013 209 234.2, which was filed on May 17, 2013, and is incorporated herein by reference in its entirety.

BACKGROUND OF THE INVENTION

When operating micromirrors, including piezoelectric micromirrors operated in resonance, a frequent objective is to implement both a high resonant frequency and a large deflection of the micromirror. However, it is difficult to achieve a high resonant frequency in combination with a large deflection of the micromirror at the same time. U.S. Pat. No. 7,190,502 B2 describes a device using which a deflection of 12.4 mm can be achieved at a resonant frequency of 10.6 kHz. U.S. Pat. No. 8,125,699 B2 shows devices using which an amplitude of 5.25 mm can be achieved at a resonance frequency of 15.6 kHz and 9 mm at a resonant frequency of 304 Hz. Devices of U.S. Pat. No. 6,657,764 B1 can be operated at amplitudes of 40 mm at a resonant frequency of 500 Hz and an amplitude of 3.9 mm at a resonant frequency of 17.2 kHz.

In order to simultaneously achieve large deflections and high resonant frequencies, EP 2233 961 A1 discloses a setup in which a vibratable, oscillating system comprises laterally arranged actuators and a micromirror arranged in the center which, connected to one another via a torsion spring, form a vibratable overall system and exhibit a common resonant frequency. In order to allow a high operating frequency, the actuators are driven in the "one-node mode", which is the frequency of the second eigenmode of a bending beam. This requires a small layer thickness of the actuators, which makes mechanical stability of the structure sensitive towards mechanical damage and constant load. At the same time, the overall system exhibits a parasitic and, in operation, undesired mode which is very close to the "one-node mode", making operation of the device presented in EP 2233 961 A1 difficult.

FIG. 12 shows a figure from EP 2233 961 A1.

U.S. Pat. No. 6,198,565 B1 presents one way of implementing micromirrors operated in resonance, using which large deflections, high resonant frequencies and operating modes which are clearly separated from other modes can be achieved. However, it is of disadvantage with this solution that the springs connecting the micromirror to the actuators are provided with high mechanical loads, with the result that high levels of material stress are already reached with moderate mirror deflections, causing the material of the springs to fail, so that the springs will break.

FIGS. 13a and 13b show pictures of such a micromirror the spring elements of which contain defects.

U. Baran et al., in their publication "High Frequency Torsional MEMS Scanner for Displays", have achieved an optical scanning angle of the micromirror of 38.5° at a resonant frequency of 39.5 kHz using a design presented in FIG. 14.

In this design, a cascading oscillator system is constructed from several vibration frames. The vibration frames here are formed of piezoelectric actuators which, in turn, are connected to the micromirror arranged in the center and an outer frame each via broad torsion springs. This avoids material overload and at the same allows a large scanning angle and, thus, a high amplitude and a high resonant frequency. Of disadvantage with this solution are, on the one hand, increased space requirements for the setup, since the dimensions of the individual components, due to the existence of a double frame and the large width of the springs, are correspondingly large and a relatively low energy efficiency of the setup, since both ends of the piezoelectric actuators are each mounted to be movable so that the force generated by the actuators cannot be transferred completely to the micromirror or the torsion springs.

Consequently, a concept for suspending a micromirror which allows both high amplitudes and scanning angles and high resonant frequencies would be desirable.

Thus, the object of the present invention is providing a device comprising a vibratably suspended optical element such that high material stress can be avoided and a higher resonant frequency of the optical element is allowed, while at the same time allowing energy-efficient operation of the device by an optimum flux of force.

SUMMARY

According to an embodiment, a device may have: an optical element suspended to be vibratable via curved spring elements; and at least two actuators, each mounted fixedly on one side, which are connected to the vibratably suspended optical element via the curved spring elements to cause the vibratably suspended optical element to vibrate.

According to another embodiment, a device may have: an optical element which is suspended to be vibratable via curved spring elements, wherein the curved spring elements are implemented such that a local orientation of each spring element along a longitudinal center line of the respective curved spring element fulfils the following characteristics: a histogram of the local orientation has a span of $\geq 60°$; the histogram is not located in a contiguous or non-contiguous interval of a length of 6° to more than 90%.

The central idea of the present invention is realizing that the above object can be achieved by connecting actuators which are each mounted fixedly on one side to the vibratably suspended micromirror via curved spring elements. The curved spring elements allow forces to be absorbed such that material failure is prevented despite high operating frequencies and deflection amplitudes.

In accordance with one embodiment, a vibratably suspended micromirror is suspended at two actuators via four torsion springs, the torsion springs being multiply curved and arranged at a distance to a torsion axis of the micromirror so as to allow large deflections of the micromirror by making use of the lever law.

In accordance with alternative embodiments, four torsion springs which connect the vibratably suspended micromirror to actuators all include only one radius of curvature, so that a larger axial extension of the actuators is combined with an efficient utilization of space by the spring elements.

Further embodiments exhibit an arrangement of more than two actuators for causing the vibratably suspended micromirror to vibrate in order to allow tilting of the micromirror around an additional axis to the torsion axis.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
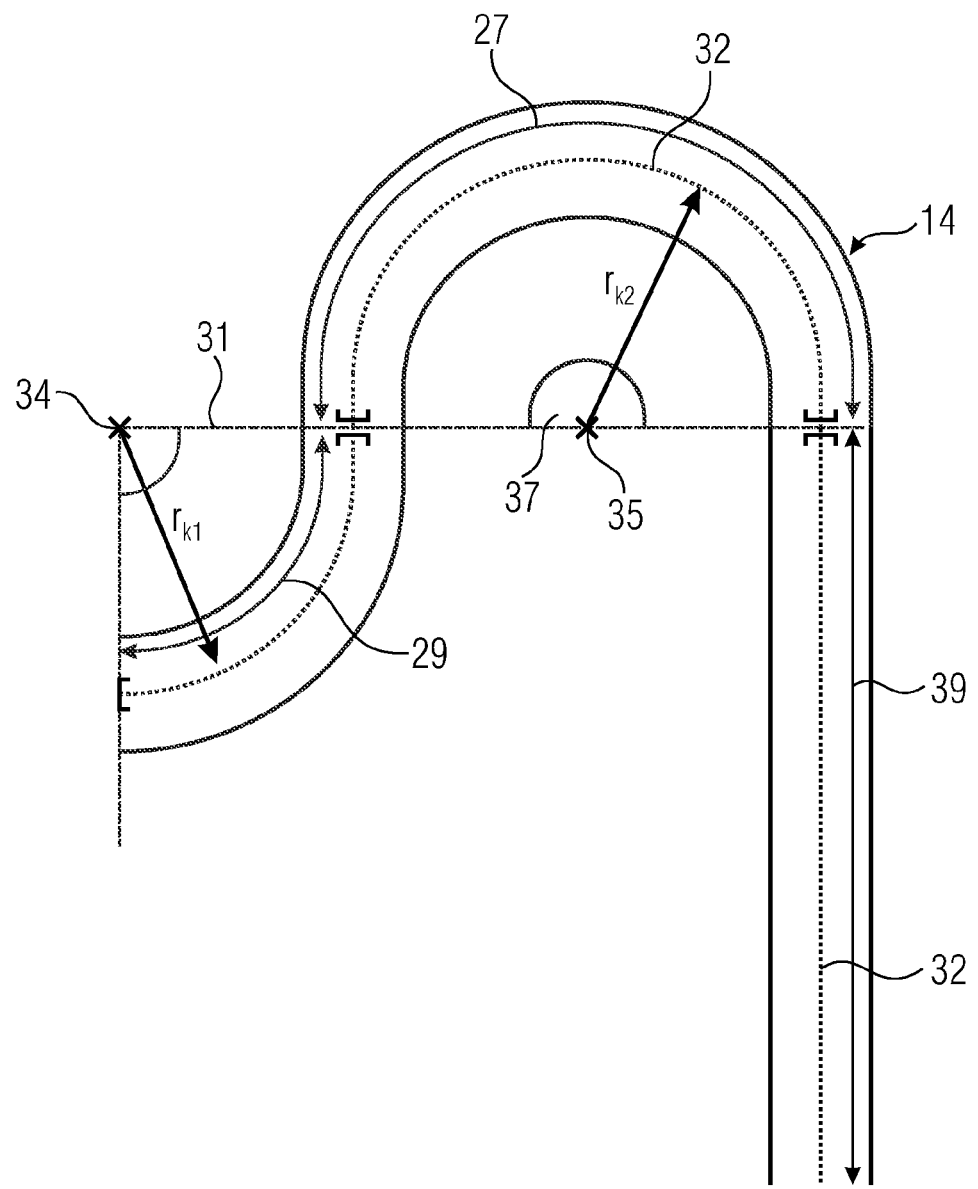
FIG. 1 is a schematic illustration of the setup of a curved torsion spring.

FIG. 1 shows a curved torsion spring 14 which includes a longitudinal center line 32 along the longitudinal extension of the spring. Starting at a first end of the longitudinal center line 32, it includes a curvature section 29 comprising a curvature of a radius of curvature $r_{K1}$ around a curvature center 34 at an aperture angle 31. The aperture angle 31 exemplarily is roughly 90°. In the further course of the longitudinal center line, it includes a curvature section 27 comprising a curvature of a radius of curvature $r_{K2}$ around a curvature center 35 at an aperture angle 37 of, exemplarily, 180°. Starting at the section 27, there is a region 39, in the direction of the second end of the longitudinal center line 32, in which the torsion spring 14 is formed to be straight and which consequently does not include any curvature, i.e. has a zero value curvature or an infinite radius of curvature.

In the sections 27 and 29, starting from the initial orientation, all the local orientations are arranged in an evenly distributed manner in an interval with a span of 90° and 180°, since all the orientations occur evenly since the sections of curvature are shaped to be arcs of a circle, whereas the local orientation in the region 39 is constant, due to the lack of curvature.

The even distributions of sections 27 and 29 result in an even height of a base region of a histogram of the torsion spring 14, whereas the sections where the torsion spring has no curvature and thus includes a constant local orientation result in an additional amplitude of the histogram for the orientations of these sections.

The radii of curvature $r_{K1}$a-d and $r_{K2}$a-d may be in any relation to one another, wherein the centers 34 and 35 of the radii of curvature are arranged alternatingly on one side each along the course of the curved torsion spring 14. A center of curvature arranged on one alternating side relative to an adjacent center of curvature corresponds to an alternating change in sign of the radius of curvature along the course of the longitudinal center line.

Although in FIG. 1 two radii of curvature, each having a center, are arranged on alternating sides along the longitudinal center line, only a single radius of curvature or any larger number of radii of curvature may be arranged along the longitudinal center line, wherein embodiments describe torsion springs comprising less than ten changes in sign of the radii of curvature.

In combination with the curvature centers 34 and 35 and the radii of curvature $r_{K1}$ and $r_{K2}$, the aperture angles 31 and 37 describe aperture angles of sectors of a circle along which the curvatures proceed, the aperture angles each being smaller than or equaling 180°.

Although, in FIG. 1, the radius of curvature changes discontinuously along the length of the torsion spring, a continuous change is of course also possible, which will be discussed in connection with FIG. 9.

Due to the alternating positioning of the curvature center relative to the side of the longitudinal center line 32, in the case of a single curvature center, the curved torsion spring 14 has the course of an arc of a circle and, in the case of several curvature centers, an S-shaped course.

Figure 2:
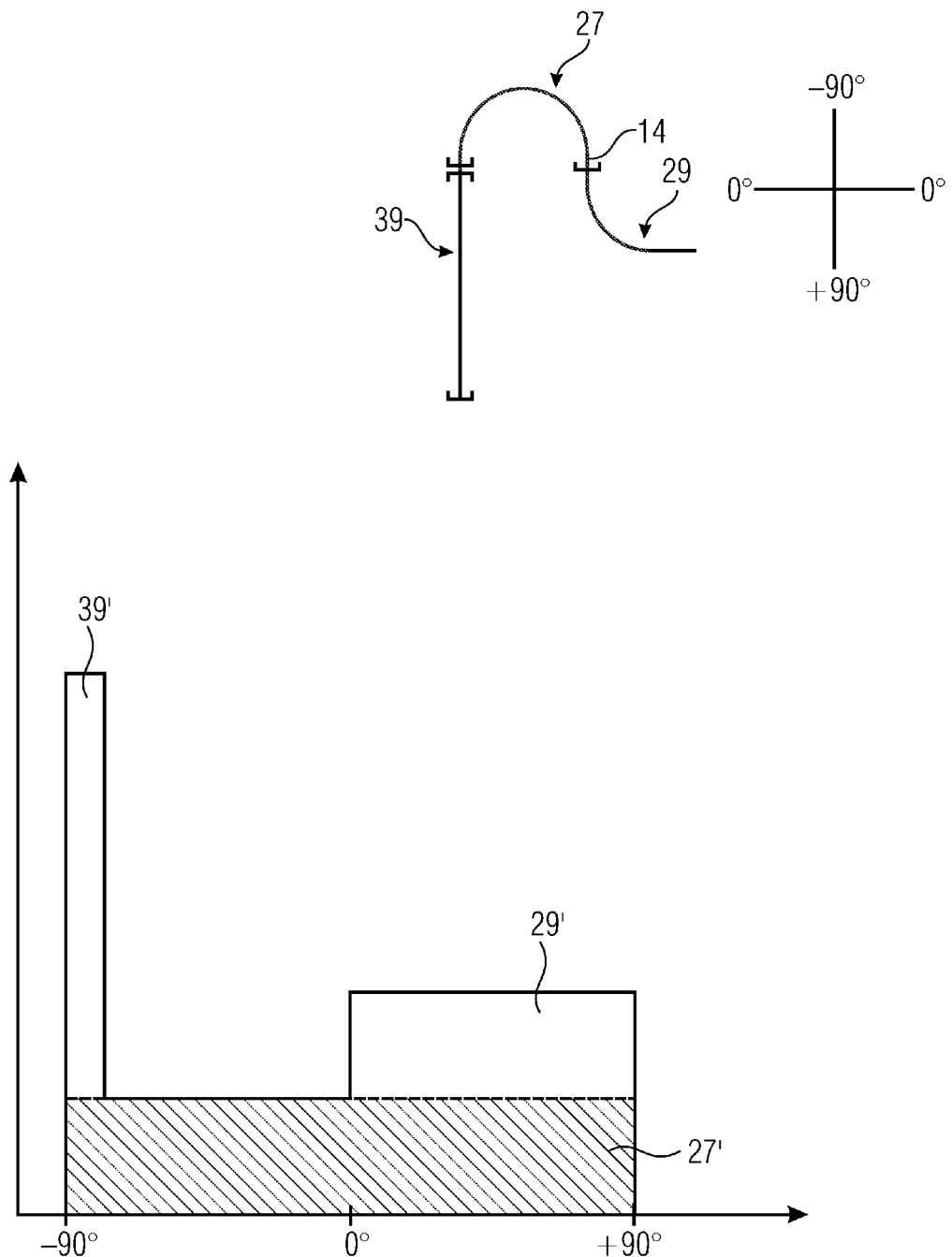
FIG. 2 shows a histogram of the curved torsion spring of FIG. 1.

FIG. 2 shows a histogram of the local orientation of a curved torsion spring 14 of FIG. 1, starting from section 39 in an orientation of −90°, which in the histogram is represented by the area 39'. In the section 39, the local orientation is constant over the longitudinal extension, so that the length of section 39 is arranged proportionately in the histogram in an orientation of −90°. The following curvature to the right of the torsion spring towards an orientation of +90° results in a hatched base region 29' in the histogram, which corresponds to the equidistribution of the local orientations along section 27 of the torsion spring 14. The curvature to the left along section 29 which follows in the further spring course in section 29, from the orientation of +90° to 0°, results in an unhatched area 29' between 0° and +90° in the histogram.

In accordance with the minimum of −90° and the maximum of +90° of the local orientations of the torsion spring, the span of the histogram is an interval of 180°. The interval here is formed continuously since every local orientation between −90° and +90° is formed in the course of the curved torsion spring 14, wherein, as is represented by the hatched base region 27' of the histogram, a portion of at least 10 percent of the histogram is distributed evenly between the minimum local orientation of −90° and a maximum local orientation of +90°.

Alternative embodiments comprise curved torsion springs of only one or several radii of curvature, so that the span of the histograms is greater than 60° and smaller than 360°.

Figure 3:
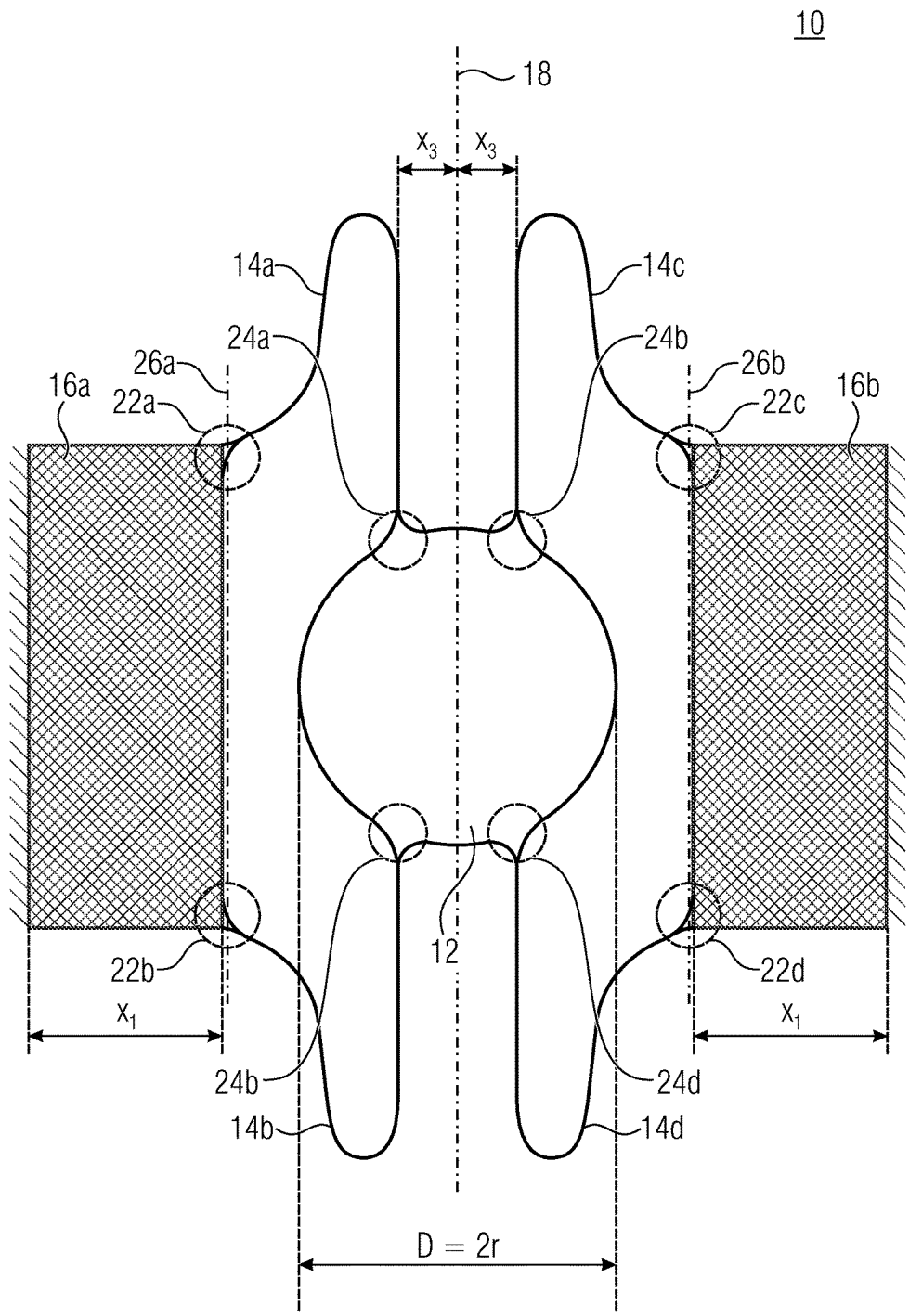
FIG. 3 shows a top view of a device comprising a micromirror arranged at actuators using curved torsion springs.

FIG. 3 shows a device 10 comprising a vibratably suspended micromirror 12 which is suspended on center at two actuators 16a and 16b via four curved torsion springs 14a-d. The actuators 16a and 16b are each cantilevered fixedly on one side and arranged such that a deflectable end of the actuator faces the micromirror 12. The actuators 16a and 16b are implemented to be piezo-actuators and each include a substrate and a piezoelectric functional layer arranged thereon so that the actuators 16a and 16b are implemented as bending beams. Driving an actuator 16a or 16b results in a deflection of the deflectable end arranged opposite the fixedly cantilevered side in the direction out of the plane of the drawing, as will be illustrated below graphically.

When the actuators 16a and 16b are operated in opposite phases so that one of the actuators 16a or 16b moves in a direction facing the viewer and the other one of the actuators moves in a direction facing away from the viewer, the micromirror 12 tilts around a torsion axis 18. However, when the actuators are operated in phase, the micromirror 12 moves out of the plane of the torsion axis 18. The actuators 16a and 16b, the micromirror 12, and the curved torsion springs 14a-d form a spring-and-mass system of a common resonant frequency. The actuators 16a and 16b are arranged to be symmetrical around the torsion axis 18, wherein an also symmetrical tilting of the micromirror 12 around the torsion axis 18 is achieved. The curved torsion springs 14a-d are connected to the actuators 16a and 16b at actuator mounting places 22a-d. The ends of the curved torsion springs 14a-d facing away from the actuators 16a and 16b are connected to the micromirror 12 at mirror mounting places 24a-d. Thus, both the actuator mounting places 22a-d and the mirror mounting places 24a-d are implemented such that the transitions from the curved torsion springs 14a-d to the actuators 16a-b and from the curved torsion springs 14a-d to the micromirror 12 are implemented to be rounded, wherein outer edges of the respective curved spring element 14a-d are guided to the actuator 16a or 16b and the micromirror 12 tangentially, wherein an angular or discontinuous transition between the elements is avoided.

The curved course of the torsion springs 14a-d allows an implementation of the springs which is provided with a larger longitudinal extension compared to spring elements of a straight course so that forces induced by a deformation of the material of the springs are distributed in a larger material region. In contrast to torsion springs redirected in an angular and, thus, discontinuous manner, a continuous transition of the different radii of curvature results in force peaks at places of discontinuity to be avoided.

A rounded transition between the actuator/spring or spring/micromirror elements reduces force peaks occurring in the material with a deformation and avoids excessive material fatigue at these places. The result is an additionally increased operating time of the device.

In order to reduce rotational or tilting movements around an axis other than the torsion axis 18, the actuator mounting places 22a-d are arranged relative to one another such that the actuator mounting places 22a and 22b and the actuator mounting places 22c and 22d are each arranged in pairs on a line 26a and 26b, respectively, the lines 26a and 26b being parallel to the torsion axis 18. In combination with a symmetrical arrangement of the mirror mounting places 24a-d, the result is minimization of movements of the micromirror 12 which are not around the torsion axis 18.

The actuators 16a and 16b may be configured such that a longitudinal extension $x_1$ of the actuators 16a and 16b is greater than a radius of the round micromirror 12. Increasing the extension $x_1$ allows a larger deflection of the deflectable end of the actuators and thus of the actuator mounting places 22a-d. Said larger deflection produces a larger material deformation which is made possible by the shape of the curved torsion springs 14a-d. Thus, the longitudinal dimension $x_1$ represents a distance from the fixed cantilevered part of an actuator 16a or 16b along an axis arranged perpendicular to the torsion axis 18 to an actuator mounting place 22a-b, i.e. a dimension along an extension in which the actuators bend as a bending beam in accordance with the implementation.

The mirror mounting places 24a-d are arranged at a distance $x_3$ from the torsion axis 18. The distance $x_3$ generates a leverage such that a deflection of the actuators 16a and 16b, induced by the actuators 16a and 16b and transmitted by the curved torsion springs 14a-d is transferred onto the micromirror 12 to an extent depending on the distance $x_3$.

The micromirror 12 in FIG. 1 is formed to be of a round shape and of a constant radius r. In embodiments, an alternative micromirror includes a different shape, exemplarily that of an ellipse. In this case, the distance $x_1$ may be selected to be larger than half of the longest distance between any two points of a main side of the micromirror 12. When, as is shown in FIG. 1, the micromirror 12 is formed to be a round element, half of the longest extension between any two points corresponds to the radius r.

The distance $x_3$ defining the leverage allows a larger deflection of the micromirror 12 relative to an arrangement of torsion springs in the torsion axis with equal forces of the actuators 16a and 16b, or an identical deflection of the micromirror 12 with a smaller actuator deflection.

Further embodiments exhibit an arrangement of several actuators, wherein the actuators are arranged to be symmetrical around the torsion axis and/or an axis of symmetry perpendicular to the torsion axis and only a single curved torsion spring is arranged at each actuator. The distance $x_2$ is then determined as the distance between two actuator mounting places in a half-plane defined by the torsion axis or the axis of symmetry.

Figure 4A:
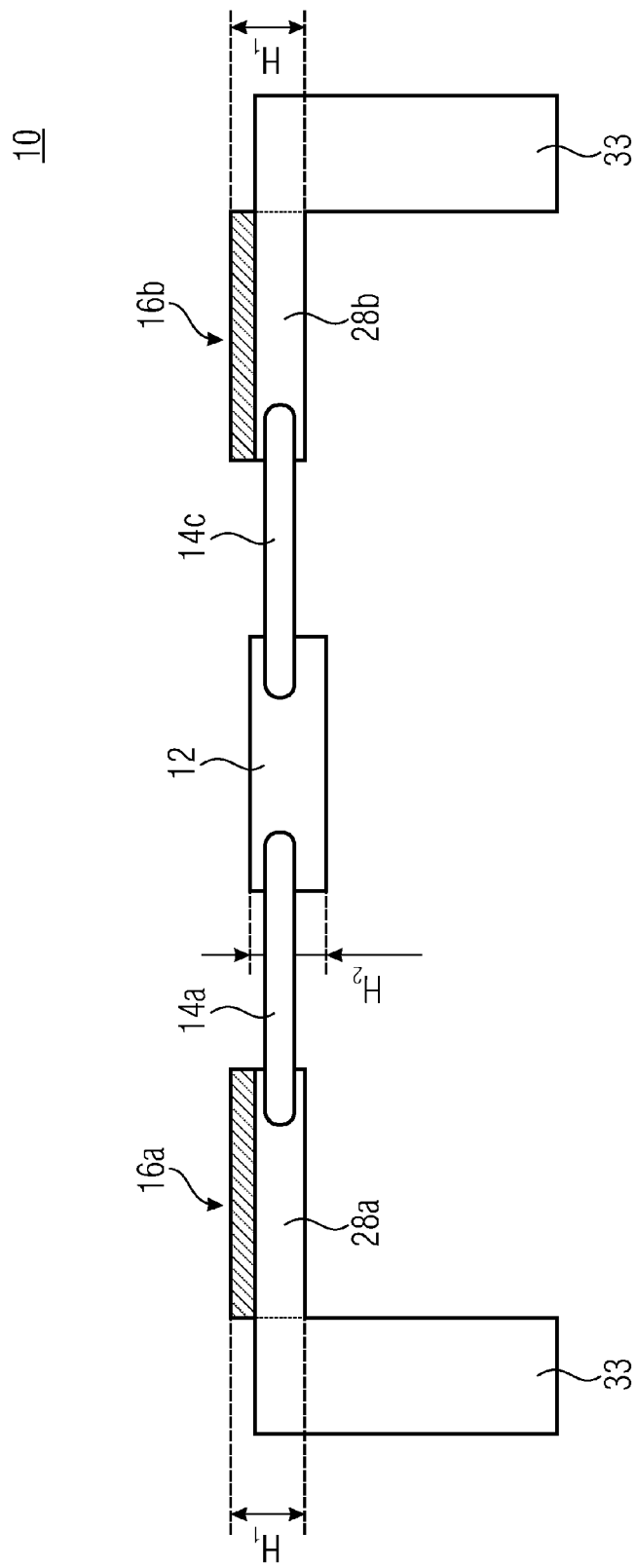
FIG. 4a shows a side view of the device of FIG. 3 in a non-deflected state.

FIG. 4a shows a side view of the device 10 in an undeflected state. The actuators 16a and 16b, in analogy to FIG. 3, are each formed as piezo actuators including a substrate 28a and 28b and a piezoelectric functional layer. The actuators 16a and 16b include a thickness $H_1$ which is in a defined relation to a thickness $H_2$ of the micromirror 12, the ratio between $H_1$ and $H_2$ roughly corresponding to 1:1. Alternative embodiments include a ratio between $H_1$ and $H_2$ between 0.1 and 2.

Figure 4B:
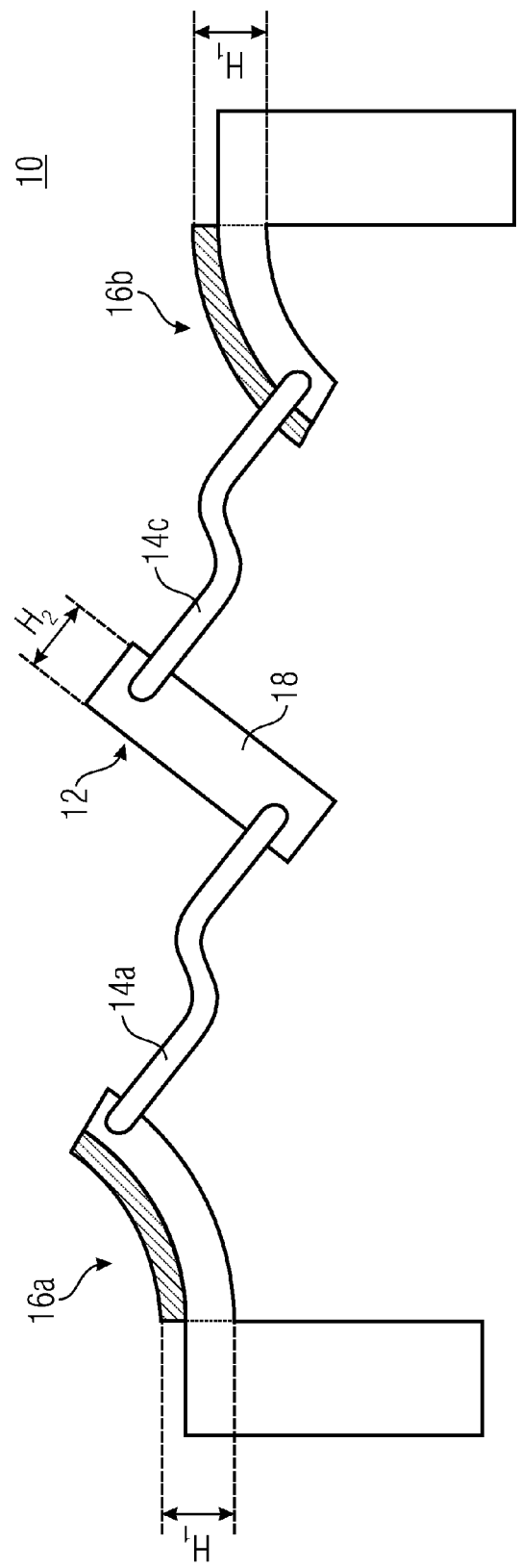
FIG. 4b shows a side view of the device of FIG. 3 in a deflected state.

The substrates 28a and 28b of the actuators 16a and 16b, the curved torsion springs 14a and 14b and the micromirror 12 may, as is exemplarily illustrated in FIGS. 4a and 4b, be formed from the same material and integrally, wherein the integral characteristic may exemplarily be achieved from a common starting medium by means of a time-controlled etching process or an etch stop layer. In addition, the substrate 33 where the actuators 16a and 16b are suspended, is also formed integrally with the substrate 28a and 28b of the actuators 16a and 16b and, thus, the curved torsion springs 14a and 14b, and the micromirror 12, so that exemplarily the time-controlled etching process removes volume parts of a portion of a wafer at laterally and axially differing locations, wherein the structures of the substrate 28a and 28b of the actuators 16a and 16b, that of the curved torsion springs 14a and 14b and of the micromirror 12 are formed, as is the substrate 33, from the wafer portion.

FIG. 4b shows the device 10 in a deflected state in which the actuator 16a is deflected in one direction and the actuator 16b in the opposite direction. The deflection of the actuators 16a and 16b results in a deformation of the curved torsion springs 14a and 14b and in tilting of the micromirror 12 around the torsion axis 18.

Figure 5:
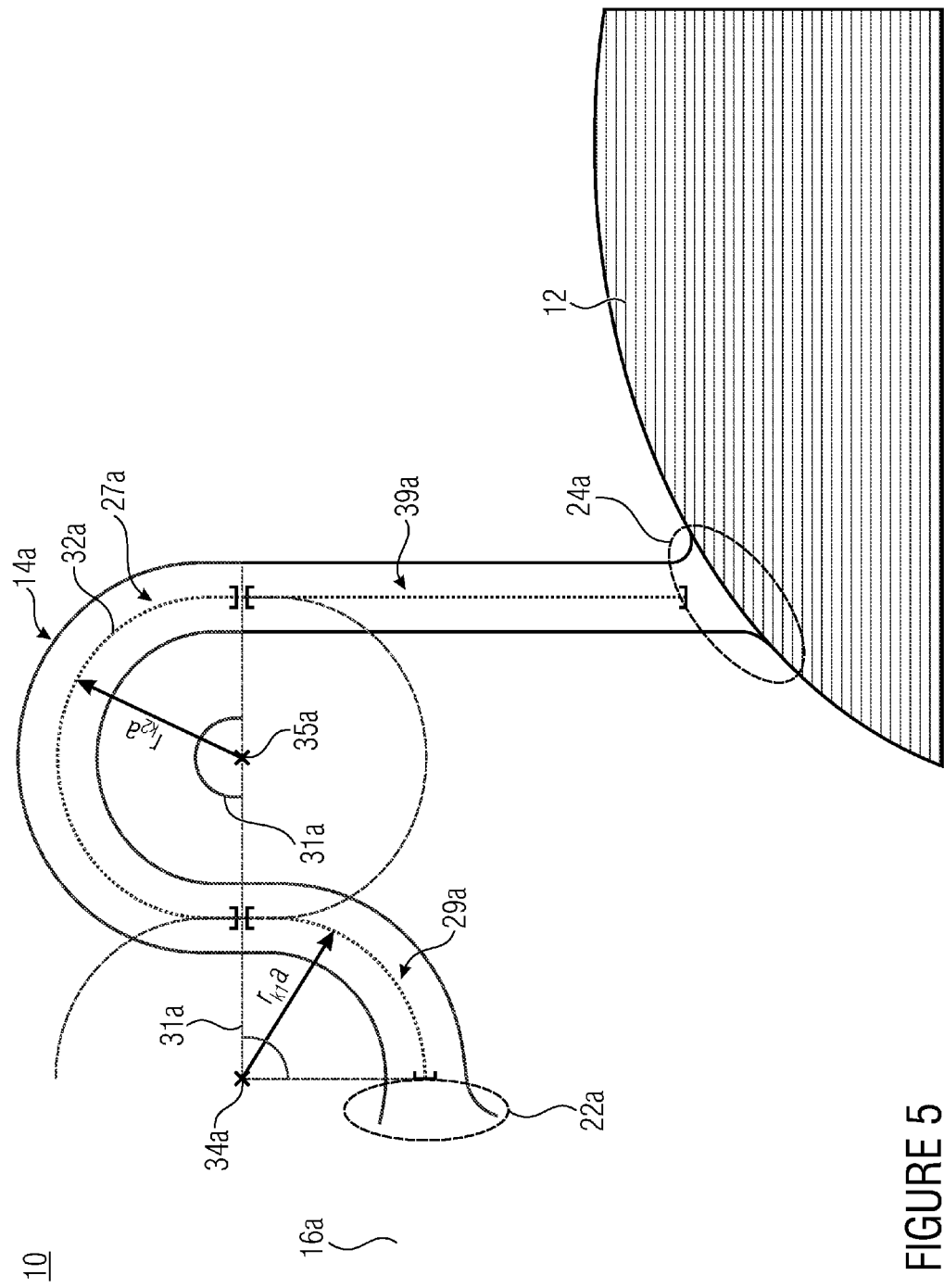
FIG. 5 shows a detailed view of a portion of the device of FIG. 3.

FIG. 5 shows part of FIG. 1 with a top view of the mounting places 22a and 24a which connect the torsion spring 14a to the micromirror 12 and the actuator 16a tangentially, and the course of the curved torsion spring 14a. Along its continuous course, a longitudinal center line 32a of the curved torsion spring 14a comprises the straight section 39a and the two curvature sections 27a and 29a each including a constant radius of curvature $r_{K1}a$ and $r_{K2}a$ and a curvature center 34a and 35a, respectively. The local radii of curvature $r_{K1}a$ and $r_{K2}a$ may be implemented such that they are each larger than half of the mean width of the curved torsion spring and at the same time, in each curvature section 27a and 29a, the mean value of the magnitude of the respective radius of curvature $r_{K1}a$ or $r_{K2}a$ is smaller than 10 times the overall length of the longitudinal center line 32a.

In accordance with alternative embodiments, a vibratably suspended optical element, exemplarily a micromirror, may also be arranged on a substrate via curved spring elements with no actuator, in particular when energy for causing the vibratably suspended optical element to vibrate is introduced into the vibratable system alternatively, exemplarily via a fluid stream flowing around the vibratably suspended optical element.

Figure 6:
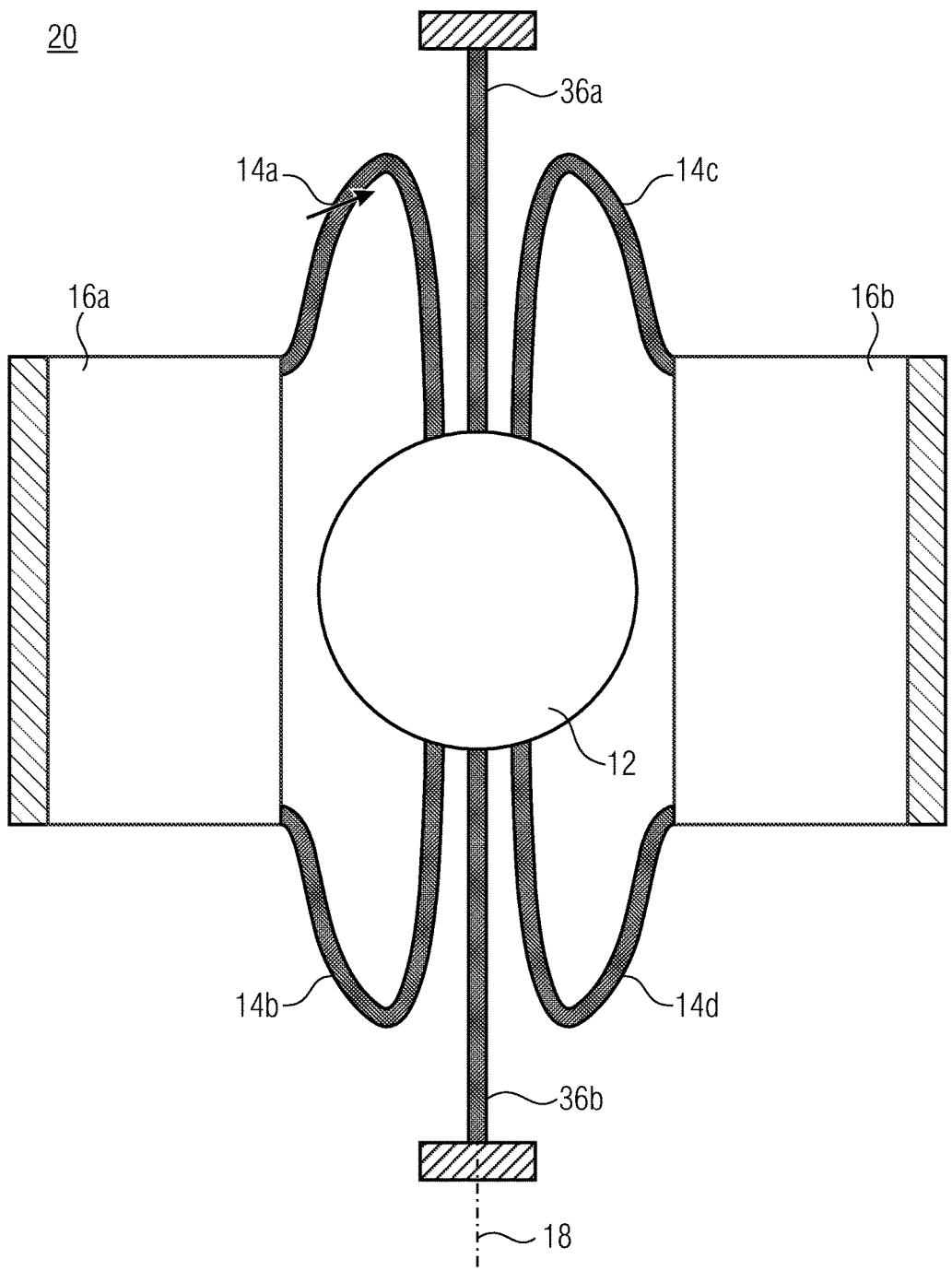
FIG. 6 shows a top view of a device in analogy to FIG. 3 in which additionally there are straight torsion springs.

FIG. 6 shows a top view of a device 20 in which the device 10 has been extended in that two additional torsion springs 36a and 36b of a straight shape are arranged at the micromirror 12, of which the end facing away from the micromirror 12 is arranged at an immobile anchor point and the longitudinal course of which is identical to the torsion axis 18. The straight torsion springs 36a and 36b here have no direct connection to the curved torsion springs 14a-d. The straight torsion springs 36a and 36b are configured to stabilize tilting of the micromirror 12.

Although the arrangement of two straight torsion springs 36a and 36b has been described for FIG. 6, alternative embodiments include a different number of straight torsion springs which are arranged symmetrically around and parallel to the torsion axis 18.

Figure 7:
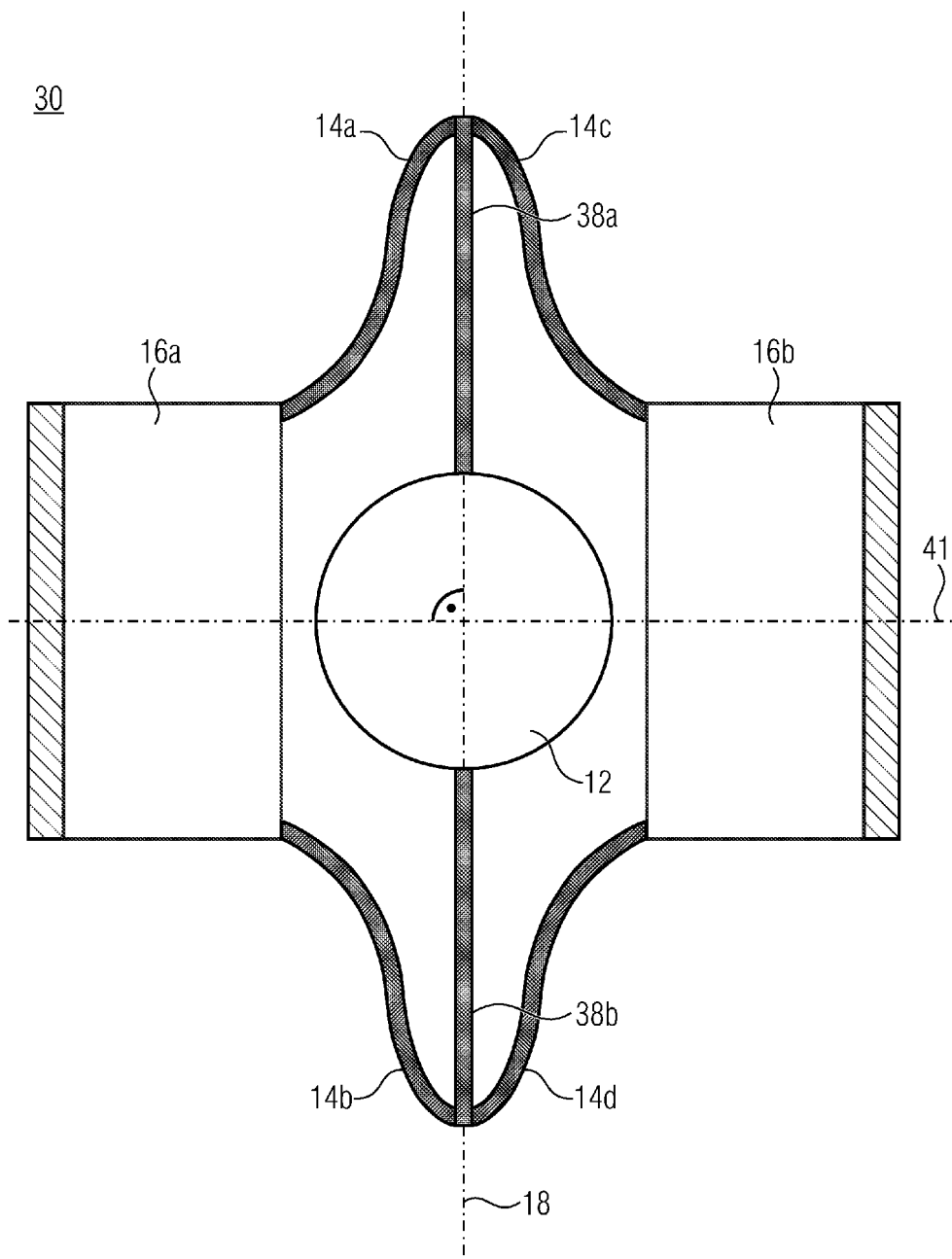
FIG. 7 shows a top view of a device in analogy to FIG. 3 in which the torsion springs comprise common regions adjacent to the micromirror.

FIG. 7 shows a top view of a device 30 in which the micromirror 12 is arranged at the actuators 16a and 16b via four curved torsion springs 14a-d. Thus, the curved torsion springs 14a-d are shaped such that two curved torsion springs 14a and 14c and 14b and 14d each arranged on a side of an axis of symmetry 41 which is arranged to be perpendicular to the torsion axis 18 include a common section 38a and 38b of the torsion spring. Starting at the respective actuator mounting places, the curved torsion springs 14a-d follow a curved course to the torsion axis 18, wherein the curved torsion spring 14a is merged with the curved torsion spring 14c and the curved torsion spring 14b is merged with the curved torsion spring 14d at the torsion axis 18, forming the further straight part 38a of the curved torsion springs 14a and 14c and the further straight part 38b of the curved torsion springs 14b and 14d, respectively. The distance $x_3$ of the device 10 in FIG. 1 is implemented with a zero extension.

Merging the curved spring elements as shown in the above embodiment allows compensating manufacturing tolerances when manufacturing the device such that, instead of four mirror mounting places, only two mirror mounting places are formed, for which consequently only one orientation relative to the torsion axis of the micromirror is necessitated, thus increasing the precision of the tilting motion of the micromirror 12.

Figure 8:
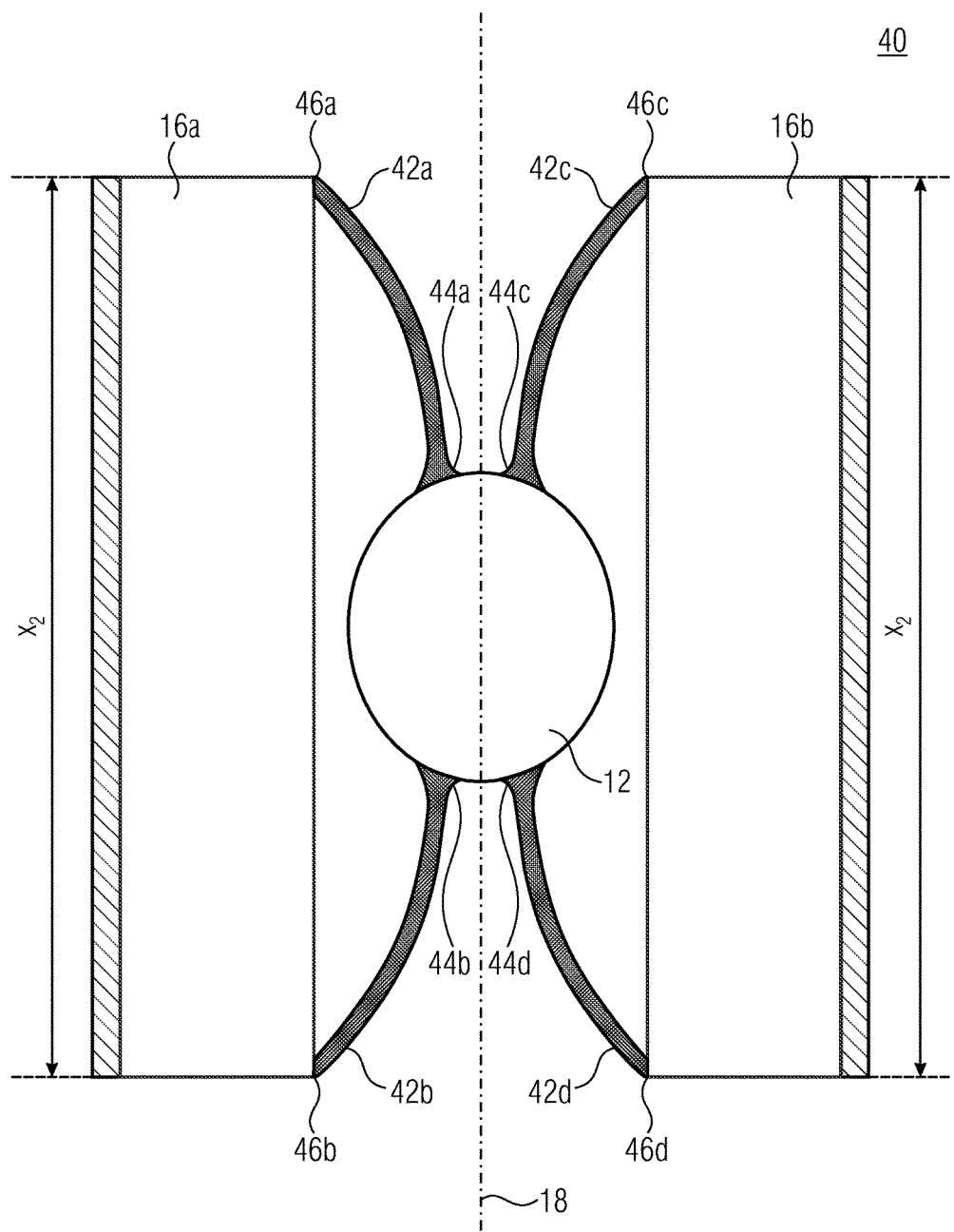
FIG. 8 shows a top view of a device comprising a micromirror arranged at actuators using singly curved torsion springs.

FIG. 8 shows a second embodiment of a torsion spring. It shows a device 40 which includes singly curved torsion springs 42a-d which connect the micromirror 12 to the actuators 16a and 16b such that an excitation induced by the actuators 16a and 16b tilts the micromirror 12 around the torsion axis 18 or moves same along a plane which includes the torsion axis 18. The singly curved torsion springs 42a-d are connected to the micromirror 12 at mirror mounting places 44a-d. Thus, the mirror mounting places 44a-d are, in analogy to the mirror mounting places of preceding embodiments, configured to be rounded, so that peaks of material stress occurring at structural transitions between the singly curved torsion springs 42a-d and the micromirror 12 are minimized.

A lateral distance $x_2$ between the actuator mounting places 46a and 46b and between 46c and 46d exemplarily is more than 150% of the largest distance between any two points of a main side of the micromirror 12. A larger extension $x_2$ results in a greater deflecting force and, thus, a faster deflection of the micromirror 12.

In analogy to the actuator mounting places 22 of the curved torsion springs 14, the actuator mounting places 46a-d of the singly curved torsion springs 42a-d are also implemented to be rounded or guided to the actuators 16a and 16b tangentially. Along a continuous longitudinal center line of the singly curved torsion springs 42a-d, all the radii of curvature of the singly curved torsion springs 42a-d are on the same side of the longitudinal center line, wherein a mean value of each radius of curvature is smaller than 10 times the length of the longitudinal center line. Thus, the singly curved torsion springs 42a-d are implemented such that their course basically corresponds to a quarter of an ellipse.

Alternative embodiments exhibit singly curved torsion springs, the course of which roughly corresponds to an arc of a circle. Thus, along the courses, the singly curved torsion springs includes one or several radii of curvature around one or several curvature centers, wherein all the curvature centers are arranged on the same side of the longitudinal center line of the respective singly curved torsion spring and each local radius of curvature has, over a length of the center line, a larger magnitude than half of a mean width of the respective singly curved torsion spring.

In order to reduce the space necessitated for the entire structure, this arrangement of singly curved torsion springs may be of advantage compared to an arrangement of curved torsion springs of the preceding embodiments. In FIG. 8, the curvature of the singly curved torsion springs 42a-d is implemented such that, starting from the actuator mounting places 46a-d, the singly curved torsion springs 42a-d include only sections which, except for the actuator mounting places 46a-d, are only directed towards the micromirror 12 or exhibit a curvature towards the micromirror 12. In preceding embodiments, the curved torsion springs 14 have been implemented such that, starting from actuator mounting places 22a-d, sections of the curved torsion springs 14a-d face away from the micromirror 12 and a maximum lateral extension, in the direction of the torsion axis 18, is defined by the lateral extension of the curved torsion springs 14a-d. The maximum lateral setup space in the direction of the torsion axis 18 of the device 40, in contrast, is defined by the lateral extension of the actuators 16a and 16b.

Figure 9:
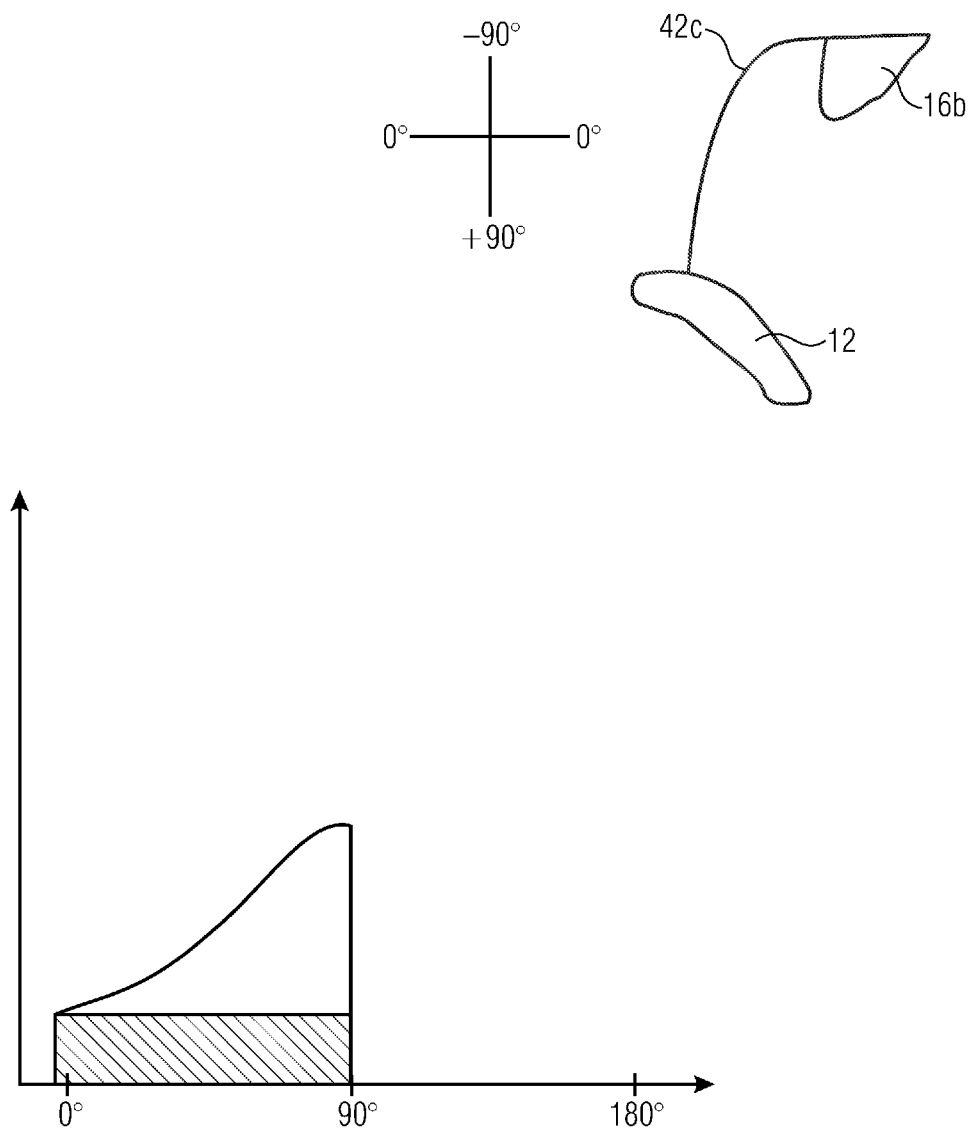
FIG. 9 shows a histogram of a singly curved torsion spring of FIG. 8.

FIG. 9 shows a histogram of the course of curvature of the singly curved torsion spring 42c of the device 40 of FIG. 8 starting from the actuator 16b in the direction of the micromirror 12. Starting with the tangential arrangement of the singly curved torsion spring 42c at the actuator 16b with the local orientation of 0°, the curvature of the singly curved torsion spring 42c develops continuously to an orientation of +90°. From a minimal orientation of 0° to a maximum orientation of +90°, the histogram has a span of 90°. At least 10% of the integral area of the histogram, which in FIG. 9 is illustrated in a hatched manner, are arranged to be evenly distributed, which means: an equidistribution over the span of an area of 10% of the histogram remains below the histogram over the entire span. At the same time, the histogram of FIG. 9 does not contain a contiguous or non-contiguous interval with a length of 6%, which includes the area of the histogram to more than 90% so that the orientations of a singly curved torsion spring include a measure of equidistribution within the span. The continuous course of the non-hatched region indicates that radii of curvature change continuously along the course of the torsion spring.

Alternative embodiments include singly curved torsion springs the histograms of which comprise spans of larger than or equal to 60° and smaller than or equal to 270°.

Figure 10:
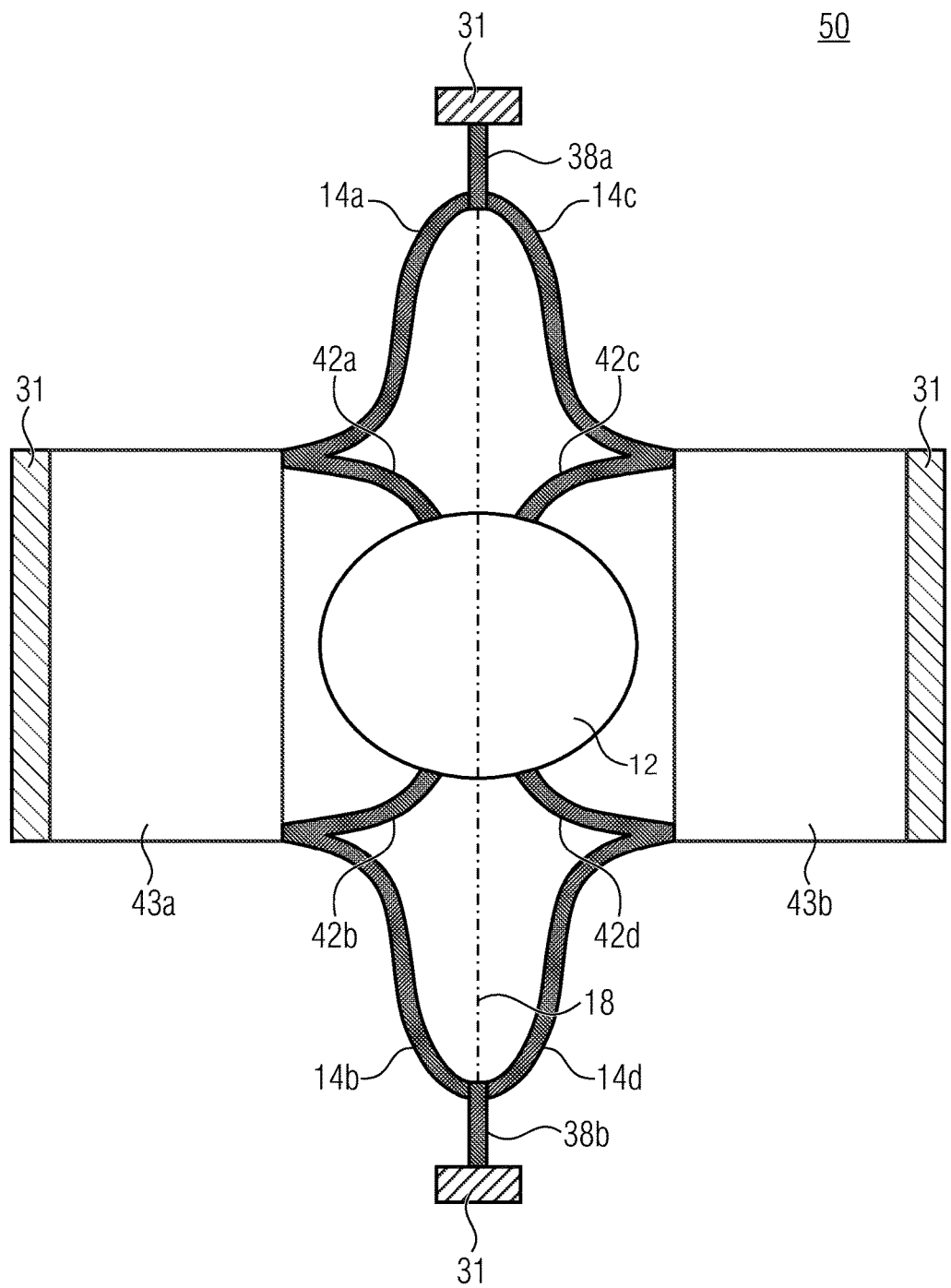
FIG. 10 shows a top view of a device in analogy to FIG. 8 in which curved torsion springs comprising a common region, in analogy to FIG. 7, are additionally arranged between actuators and an anchor point.

FIG. 10 shows a schematic top view of a device 60 including a micromirror 12 which is arranged at the actuators 16a and 16b via four singly curved torsion springs 42a-d. Additionally, curved torsion springs 14a-d which support deflection of the actuators 16a and 16b relative to the substrate 33 are arranged at the actuators 16a and 16b. The curved torsion springs 14a and 14c and 14b and 14d each comprise, in pairs and in analogy to FIG. 5, the common sections 38a and 38b, respectively, of the curved torsion springs.

By additionally arranging curved torsion springs between the actuators and the substrate, stabilization of the deflection motion can be achieved, wherein, in principle, any combination of curved and singly curved torsion springs is possible.

In principle, the ends of the curved torsion springs 14a-d facing away from the actuators 16a and 16b may also be arranged at further actuators in order for the micromirror 12 to be arranged to be rotatable along a second axis different from the torsion axis 18 and movable along an axis perpendicular to the torsion axis 18.

Figure 11:
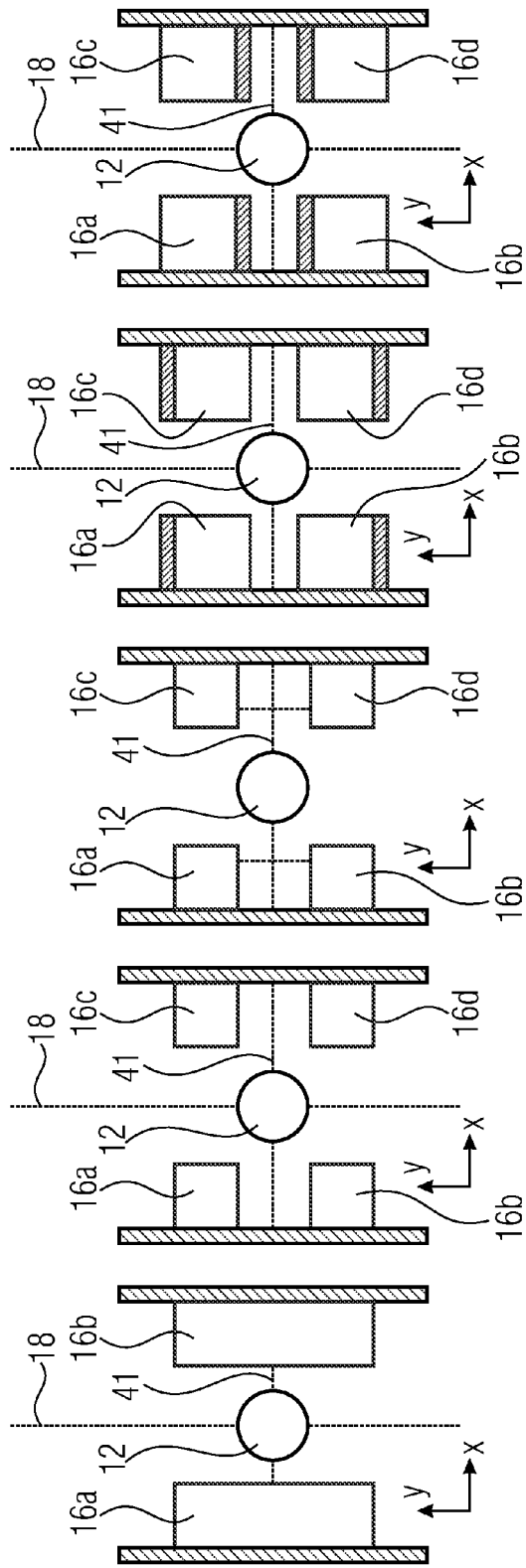
FIGS. 11a-e show schematic views of different arrangements of actuators relative to the torsion axis and another axis of symmetry.
Figure 12:
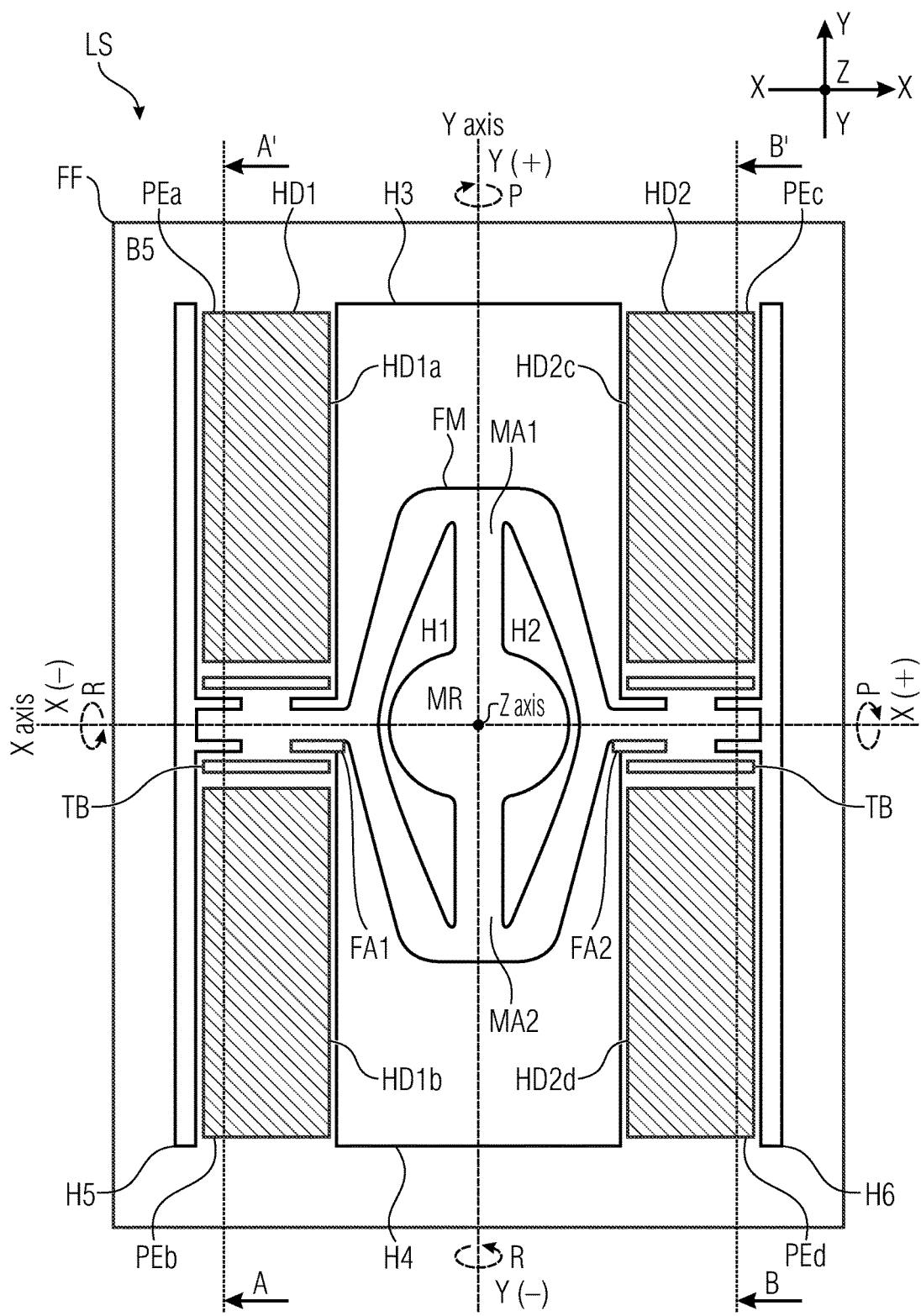
FIG. 12 shows a schematic top view of a device comprising torsion springs in accordance with known technology.

FIG. 11 schematically shows ways of arranging actuators 16a-d relative to the micromirror.

FIG. 11a, in analogy to the preceding embodiment, shows a symmetrical arrangement of the actuators 16a and 16b around the torsion axis 18. The actuators 16a and 16b here are cantilevered fixedly at a side facing away from the micromirror 12, in a parallel manner and spaced apart from the torsion axis 18, and are arranged to be symmetrical to the axis of symmetry 41.

FIG. 11b shows an arrangement of four actuators 16a-d which are arranged to be both symmetrical to the torsion axis 18 and symmetrical to the axis of symmetry 41, so that one actuator 16a-d each is arranged in a quadrant of a coordinate system spanned by the torsion axis 18 and the axis of symmetry 41.

FIG. 11c shows an arrangement of actuators in analogy to FIG. 11b, wherein an arrangement of further actuators is indicated by points between the actuators 16a and 16b and between the actuators 16c and 16d. Further actuators are arranged to be symmetrical to the axis of symmetry 41. When, for example, an additional fifth and sixth actuator are arranged, FIG. 11b is extended in that the additional fifth and sixth actuator are arranged in the course of the axis of symmetry 41.

FIG. 11d shows an arrangement of actuators 16a-d in analogy to FIG. 11b, wherein the actuators are cantilevered fixedly in a course in parallel to the axis of symmetry 41 and the freely deflectable ends of the actuators 16a-d are facing the axis of symmetry 41 and are in parallel to the axis of symmetry 41.

FIG. 11e shows an arrangement of actuators 16a-d in analogy to FIG. 11d, wherein the fixed cantilevered part of the actuators 16a-d is arranged to be facing the axis of symmetry 41 and the freely deflectable end of the actuators 16a-d to be facing away from the axis of symmetry 41.

In principle, any number of actuators may be arranged, wherein the actuators are arranged to be both symmetrical to the torsion axis 18 and symmetrical to the axis of symmetry 41, which is perpendicular to the torsion axis 18, and the axes of symmetry cross in the center of the micromirror 12.

The embodiments described provide an oscillating system which includes a micromirror and external piezoelectric actuators. In contrast to known solutions, the actuators may be implemented such that they exhibit higher resonant frequencies than the micromirror, so that a greater layer thickness of the actuators may be used and the entire structure is implemented to be more robust due to the large layer thickness.

Furthermore, the actuators may be operated in the zero-node mode, the first eigenmode of a bending beam. In contrast to the one-node mode, in the zero-node mode, neighboring parasitic modes in the frequency range are at relatively large distances to one another, so that the eigenmode is predominant and the influence of parasitic modes, which limits operation of the micromirror, is reduced.

Figure 13B:
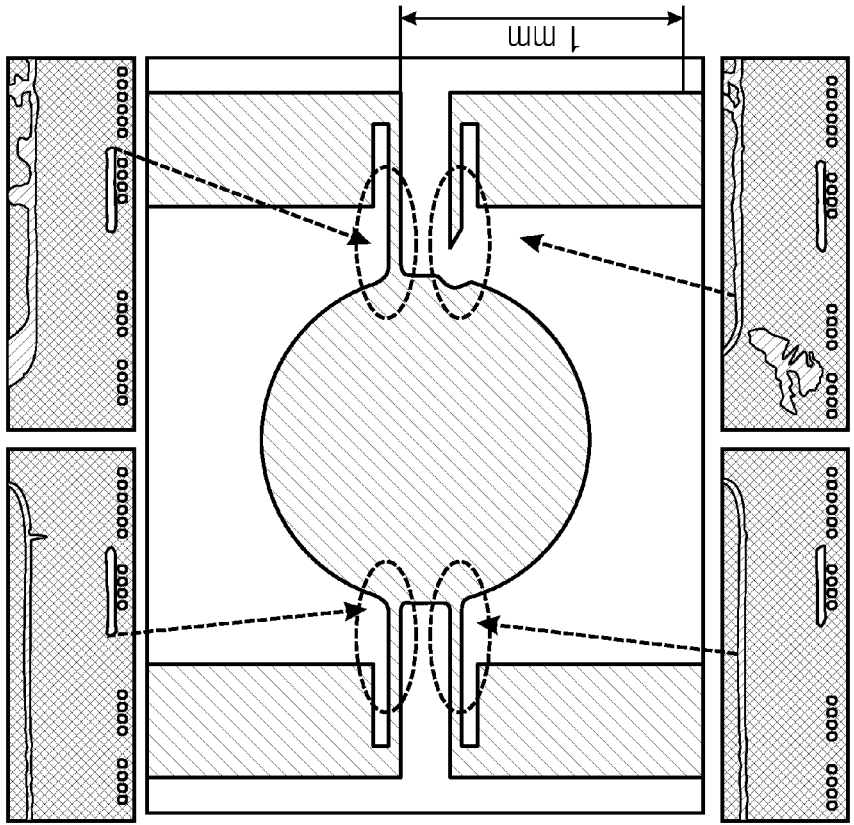
FIGS. 13a-b show pictures of a device comprising torsion springs in accordance with known technology, exhibiting defects.
Figure 13A:
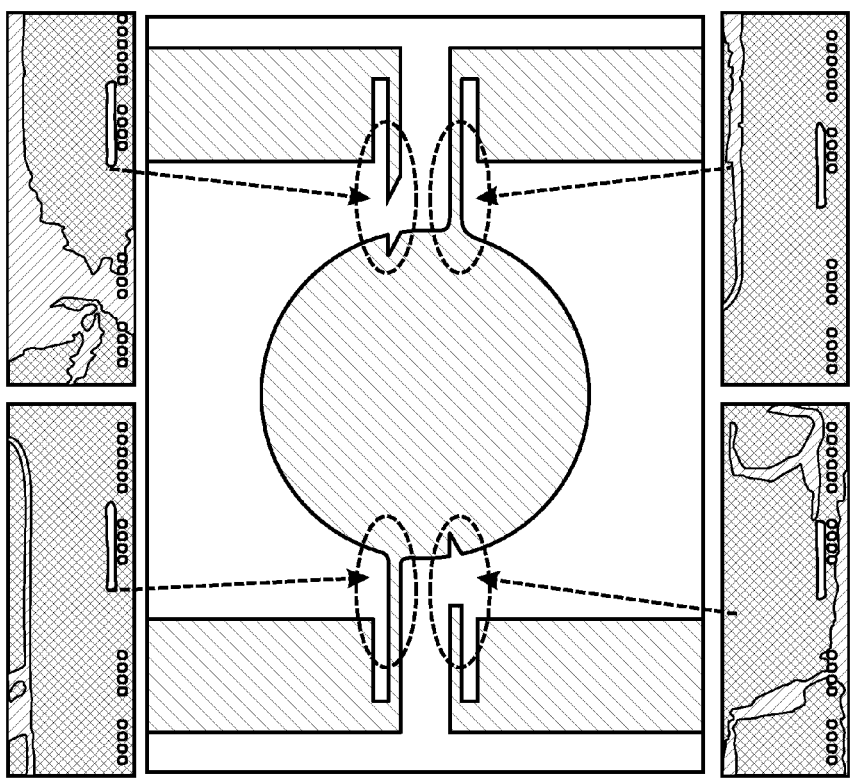
Figure 14:
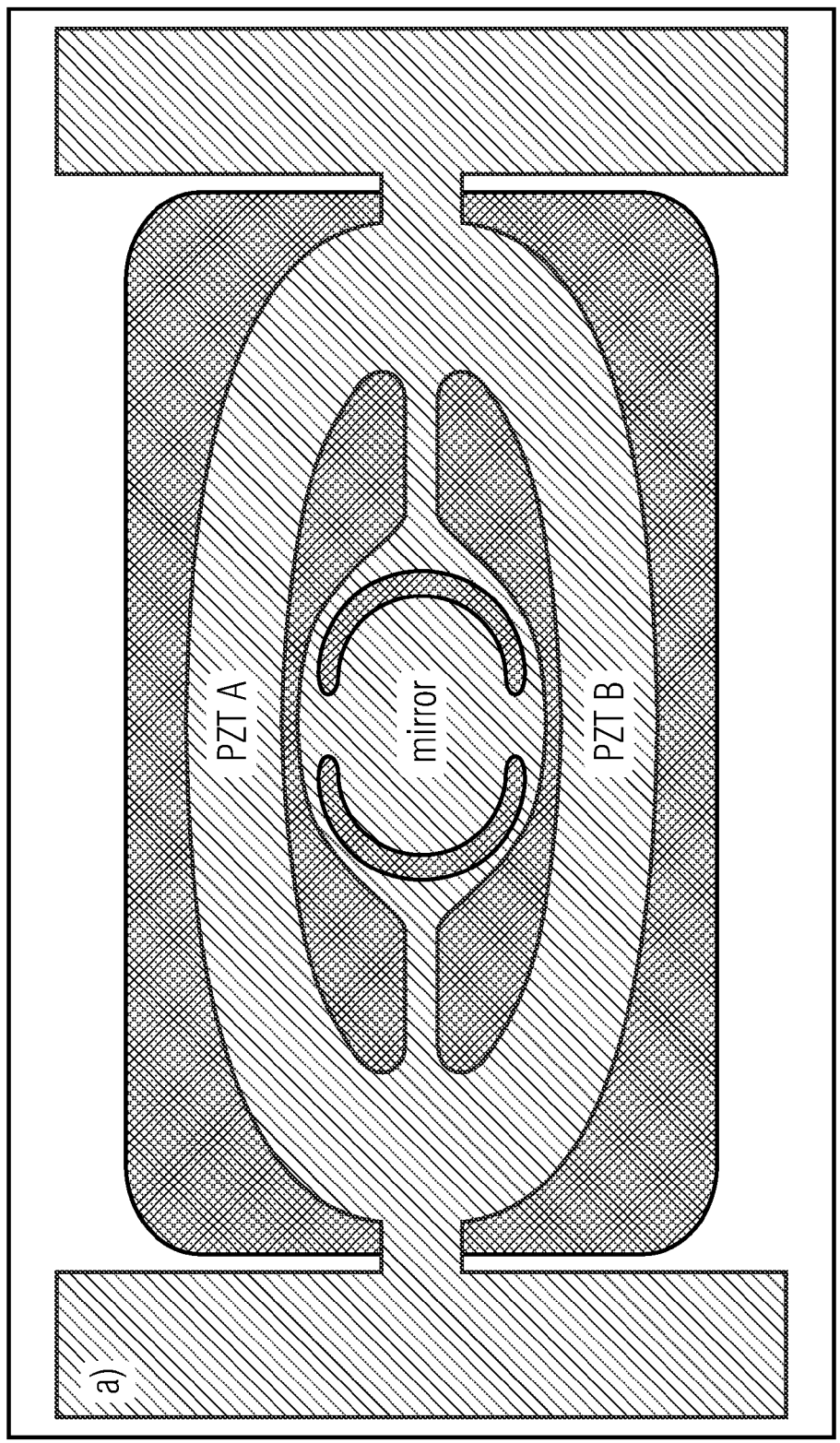
FIG. 14 is an illustration of a device comprising curved torsion springs in which the actuators are arranged to be deflectable on both sides.

Furthermore, discontinuous material courses of torsion springs, like, for example, in the torsion springs shown in FIG. 13, formed at a 90° angle are avoided by the curved and singly curved torsion springs comprising a continuous course, and thus force peaks and mechanically overstressed locations along the course of the curved and singly curved torsion springs are prevented. Rounded or tangentially implemented mounting places of the springs at the micromirror and/or actuators additionally prevent mechanically overstressed locations from occurring at the ends of the torsion springs.

All in all, the micromirror system described comprises a high resonant frequency and is of a stable and robust design. When the torsion springs are arranged on the micromirror at a distance from the torsion axis, the lever arm may be made use of in that the distance from the torsion axis to the mirror mounting places acts as a lever arm and the force of the actuators is transferred efficiently, thereby achieving a large deflection of the micromirror. Using the torsion springs as a lever at the same time prevents locations with too high a mechanical stress due to the design of the torsion springs and the mounting places at the actuators and the micromirror.

Although the preceding embodiments have shown torsion springs connecting a micromirror to actuators, in principle different elements may also be arranged at the ends of the torsion springs facing away from the actuators, such as, for example, lenses or parts of electronic switches.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:
1. A device comprising:
an optical element suspended to be vibratable via curved spring elements; and
at least two actuators, each mounted fixedly on one side, which are connected to the vibratably suspended opti- cal element via the curved spring elements to cause the vibratably suspended optical element to vibrate;

wherein the spring elements are curved at a local radius of curvature, wherein each curved spring element is shaped such that the radii of curvature change continuously along the course of the spring elements.

2. The device in accordance with claim 1, wherein the actuators are arranged to be symmetrical around a torsion axis of the vibratably suspended optical element.

3. The device in accordance with claim 1, wherein the actuators are arranged to be symmetrical around an axis of symmetry which is perpendicular to the torsion axis of the vibratably suspended optical element.

4. The device in accordance with claim 1, wherein each actuator comprises a piezo-element.

5. The device in accordance with claim 1, wherein a dimension of each actuator from a place of fixed support of the respective actuator to a mounting place where the respective actuator is connected to one of the curved spring elements is greater than half of the longest dimension of the vibratably suspended optical element and the longest dimension is the largest distance between two points of the optical element.

6. The device in accordance with claim 1, wherein mounting places where the actuators are connected to the curved spring elements are located on two lines and are symmetrical to a torsion axis.

7. The device in accordance with claim 1, wherein the vibratably suspended optical element is implemented as a mirror.

8. The device in accordance with claim 1, wherein the spring elements are implemented to be torsion springs.

9. The device in accordance with claim 1, wherein the spring elements are connected to the vibratably suspended optical element in a manner spaced apart from a torsion axis thereof.

10. The device in accordance with claim 1, wherein the device comprises an additional spring element which is connected to the vibratably suspended optical element at a torsion axis thereof and is free of direct connections to the curved spring elements.

11. The device in accordance with claim 1, wherein a first spring element and a second spring element comprise a common region.

12. The device in accordance with claim 1, wherein the mounting places of the curved spring elements are rounded.

13. The device in accordance with claim 1, wherein the curved spring elements and the vibratably suspended optical element are formed integrally from a substrate from which a mounting is formed where the actuators are mounted fixedly.

14. The device in accordance with claim 1, wherein the curved spring elements are implemented such that a local orientation of each spring element along a longitudinal center line of the respective curved spring element fulfils the following characteristics:

a histogram of the local orientation comprises a span of ≥60°;

the histogram is not located in a contiguous or non-contiguous interval of a length of 6° to more than 90%.

15. The device in accordance with claim 1, wherein each curved spring element is shaped such that the local orientation along a longitudinal center line is of a continuous course.

16. The device in accordance with claim 1, wherein each curved spring element is shaped such that a local radius of curvature of a longitudinal center line comprises a magnitude of more than half of a mean width of the respective curved spring element over a length of the longitudinal center line.

17. The device in accordance with claim 16, wherein each curved spring element is shaped such that a mean value of the magnitude of the radius of curvature is smaller than 10 times the length of the longitudinal center line over sections of the longitudinal center line where the respective spring element is curved.

18. The device in accordance with claim 1, wherein a span of the histogram is in a range of ≥60° to ≤360°.

19. The device in accordance with claim 1, wherein at least 10% of the histogram are evenly distributed between a minimum local orientation and a maximum local orientation.

20. The device in accordance with claim 1, wherein each curved spring element is shaped such that a local radius of curvature comprises less than 10 changes in sign along a longitudinal center line.

21. A device comprising:

an optical element which is suspended to be vibratable via curved spring elements, wherein the curved spring elements are integrally formed with the optical element and implemented such that a local orientation of each spring element along a longitudinal center line of the respective curved spring element fulfils the following characteristics:

a histogram of the local orientation comprises a span of ≥60°;

the histogram is not located in a contiguous or non-contiguous interval of a length of 6° to more than 90%;

wherein a distance between the mounting places of an actuator is more than 150% of the largest distance between any two points of a main side of the optical element.

22. The device in accordance with claim 21, wherein each curved spring element is shaped such that the local orientation along a longitudinal center line is of a continuous course.

23. The device in accordance with claim 21, wherein each curved spring element is shaped such that a local radius of curvature of the longitudinal center line comprises a magnitude of more than half of a mean width of the respective curved spring element over a length of the longitudinal center line.

24. The device in accordance with claim 21, wherein each curved spring element is shaped such that a mean value of the radius of curvature is smaller than 10 times the length of the longitudinal center line over sections of the longitudinal center line where the respective spring element is curved.

25. The device in accordance with claim 21, wherein a span of the histogram is in a range from ≥60° to ≤270°.

26. The device in accordance with claim 21, wherein at least 10% of the histogram are evenly distributed between a minimum local orientation and a maximum local orientation for each class of values of curvature of the histogram.

* * * * *